US006856006B2

(12) United States Patent
Kuo

(10) Patent No.: US 6,856,006 B2
(45) Date of Patent: Feb. 15, 2005

(54) ENCAPSULATION METHOD AND LEADFRAME FOR LEADLESS SEMICONDUCTOR PACKAGES

(75) Inventor: Frank Kuo, Kaohsiung (TW)

(73) Assignee: Siliconix Taiwan LTD, Kaohsiung (TW)

( * ) Notice: Subject to any disclaimer, the term of this patent is extended or adjusted under 35 U.S.C. 154(b) by 0 days.

(21) Appl. No.: 10/113,526

(22) Filed: Mar. 28, 2002

(65) Prior Publication Data

US 2003/0183910 A1 Oct. 2, 2003

(51) Int. Cl.[7] ........................ H01L 23/495; H01L 21/44; H01L 21/48; H01L 21/50

(52) U.S. Cl. ........................ 257/667; 438/123; 438/124

(58) Field of Search .......................... 435/123; 257/666, 257/667; 438/123, 124, 112, 15, 25, 51, 55, 64, 106; 174/52.2, 52.3

(56) References Cited

U.S. PATENT DOCUMENTS 4,554,126 A * 11/1985 Sera ...................... 264/272.17
4,900,501 A * 2/1990 Saeki et al. ............ 264/272.17
5,049,526 A * 9/1991 McShane et al. ............. 29/827
5,052,907 A * 10/1991 Matumoto et al. .......... 425/116
5,059,373 A * 10/1991 Hirabayashi ................ 264/154
5,645,864 A * 7/1997 Higuchi ...................... 425/116
5,672,550 A * 9/1997 Tsuji et al. ............ 264/272.17
5,897,883 A * 4/1999 Cho et al. ................... 425/116
6,046,507 A * 4/2000 Hatchard et al. ........... 257/790
6,214,273 B1 * 4/2001 Liang et al. ........... 264/272.14
6,319,450 B1 * 11/2001 Chua et al. ............ 264/272.17
6,482,675 B2 * 11/2002 Hsu et al. ................... 438/106
2001/0049159 A1 * 12/2001 Hsu et al. ................... 438/112

FOREIGN PATENT DOCUMENTS

JP 58-128745 * 8/1983
JP 2000-31180 * 1/2000

OTHER PUBLICATIONS

Translation of JP 2000–31180 A, Jan. 28, 2000, 7 pages.*

* cited by examiner

*Primary Examiner*—Erik Kielin
*Assistant Examiner*—James M. Mitchell
(74) *Attorney, Agent, or Firm*—Murabito & Hao LLP

(57) ABSTRACT

An encapsulation technique for leadless semiconductor packages entails: (a) attaching a plurality of dice (411) to die pads in cavities (41–45, 51–55) of a leadframe, the cavities arranged in a matrix of columns and rows; (b) electrically connecting the dice to a plurality of conducting portions (412–414) of the leadframe; and (c) longitudinally injecting molding material into the cavities along the columns via a plurality of longitudinal gates (46–49, 56–59) of the leadframe to package the dice in the cavities, the longitudinal gates situated between the cavities along the columns.

7 Claims, 3 Drawing Sheets

ENCAPSULATION METHOD AND LEADFRAME FOR LEADLESS SEMICONDUCTOR PACKAGES

BACKGROUND OF THE INVENTION

1. Field of the Invention

The present invention relates to an encapsulation method and leadframe for semiconductor packages and, more particularly, to an encapsulation method and leadframe for leadless semiconductor packages.

2. Description of the Related Art

Conventional encapsulation methods for packaging semiconductor devices are classified into two kinds. The first encapsulation method is applied to semiconductor packages with leads, as shown in FIG. 1. A plurality of dice are respectively mounted in cavities 11 of a leadframe 1, and are connected to the pins of the leadframe 1. The leadframe 1 has runner 12, and the runner 12 is connected to cavities 11 by sub-runners 13 and gates 14. Each gate 14 is an injection inlet between a sub-runner 13 and a cavity 11. Molding material is injected into the runner 12 and moves via the sub-runners 13 and the gates 14 to cavities 11 so as to package the dice in cavities 11. This encapsulation method requires space for the runner 12 and the sub-runners 13, thereby decreasing the number of dice within the leadframe area, and does not have high packaging efficiency.

The second encapsulation method is applied to leadless semiconductor packages, as shown in FIG. 2. A plurality of dice 22 are placed in a cavity 21. Molding material is injected into the cavity 21 to package the dice 22. Therefore, the number of dice within the leadframe is increased, and the cost of the leadframe can be decreased. However, the second method must use cutting equipment to cut the packaged semiconductor devices into individual pieces, and the cutting equipment is usually expensive. Therefore, the cost of the second method is high. Furthermore, after the semiconductor devices are cut, every one of the semiconductor devices must be transferred to a tray or a tube so that the steps of the second method are complex and the efficiency of the second method is low.

Besides, as shown in FIG. 3, each packaged semiconductor device 3 has no contact leads. Instead, device 3 has a plurality of conducting portions 31 for connection to a circuit board. When the leadless semiconductor device 3 is packaged, molding flash must not remain on the conducting portions 31. Therefore, during the packaging process, a film at the bottom of the semiconductor device 3 is needed to prevent molding flash from remaining on the conducting portions 31. Such a film increases the cost of the second method and degrades the efficiency.

On the other hand, the second method must utilize an upper mold and a lower mold to clamp the periphery of the leadframe 2, and the molding material is injected into the cavity 21 formed by the upper and lower molds. Because the cavity 21 is large, the upper and lower molds can only clamp the periphery of the leadframe 2. The middle portion of the cavity 21 cannot be clamped by the upper and lower molds. This will easily cause molding flash to remain on the conducting portions 31.

Therefore, it is desirable to provide a creative and improved encapsulation method and leadframe to overcome the above problems.

SUMMARY OF THE INVENTION

One objective of the present invention is to provide a leadframe for leadless semiconductor packages. The present leadframe comprises: a plurality of cavities and a plurality of longitudinal gates. Each cavity has at least one die pad for supporting at least one die. Each cavity has a plurality of conducting portions for electrical connection to the die or dice on the die pad or pads. The cavities are arranged in a matrix configuration and classified into a plurality of columns and a plurality of rows. The longitudinal gates are situated between the cavities along the columns. Molding material is injected into the cavities along the columns via the longitudinal gates to package the dice in the cavities.

Therefore, the leadframe of the invention does not have the runner of the conventional leadframe, and can have more space to support more dice. The density of dice accommodated by the present leadframe can be high, and the packaging efficiency can be improved. Besides, the molding material remaining in the runner can be minimized by using the leadframe of the invention so as to decrease the manufacturing cost.

Another objective of the invention is to provide an encapsulation method for leadless semiconductor packages. The method comprises the steps of: (a) attaching a plurality of dice to die pads in a plurality of cavities of a leadframe, the cavities arranged in a matrix configuration and classified into a plurality of columns and a plurality of rows; (b) electrically connecting the dice on the die pads to a plurality of conducting portions of the leadframe; and (c) longitudinally injecting molding material into the cavities along the columns via a plurality of longitudinal gates of the leadframe to package the dice in the cavities, the longitudinal gates situated between the cavities along the columns.

The method of the invention does not need a film to prevent molding flash, and can solve the problem of molding flash remaining on the conducting portions. The method of the invention does not use expensive cutting equipment so as to decrease the cost and to upgrade the efficiency.

DETAILED DESCRIPTION OF THE INVENTION

Figure 4:
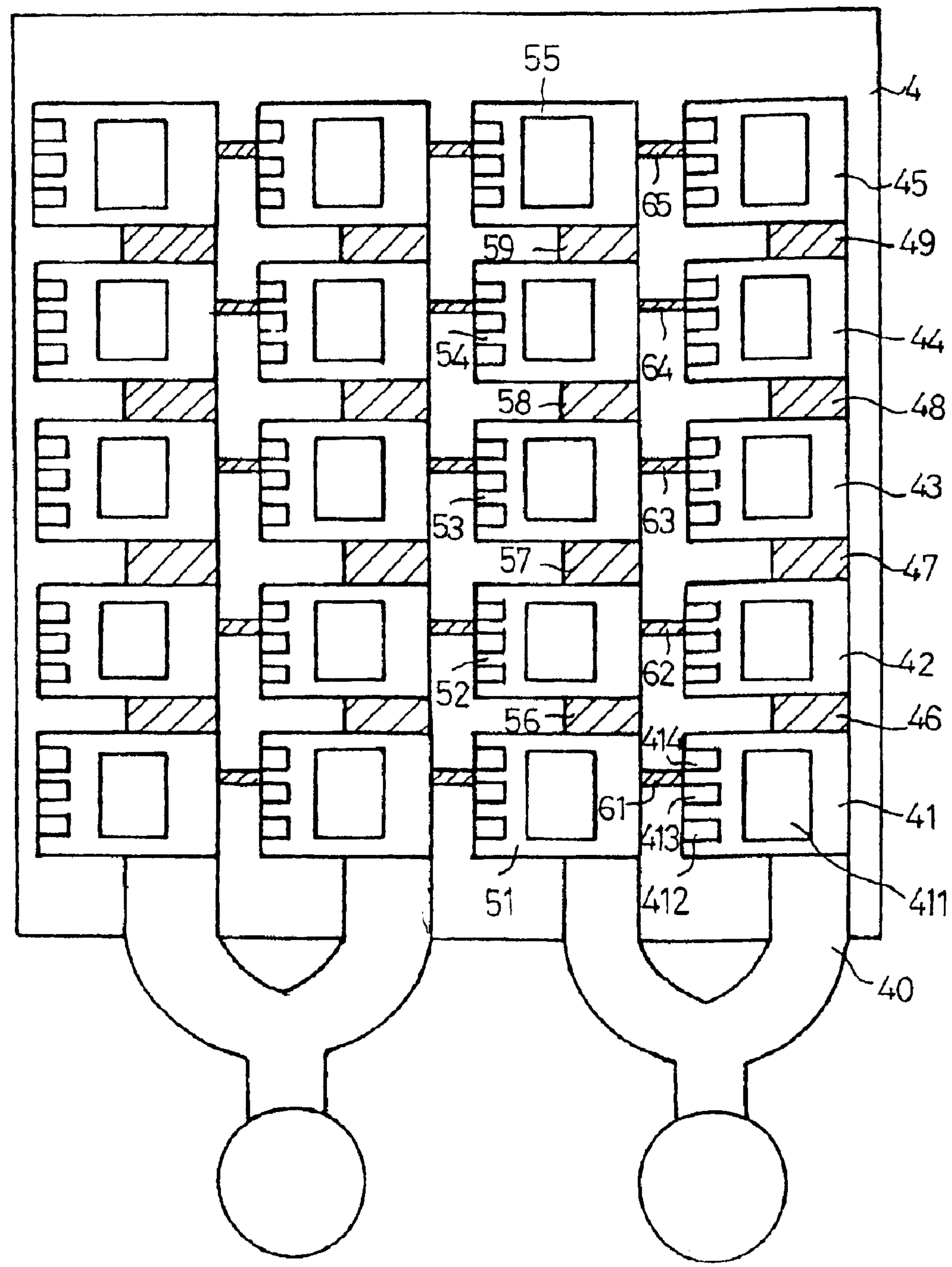
FIG. 4 shows a top-view of a leadframe for leadless semiconductor packages according to the present invention.

Referring to FIG. 4, according to the invention, a leadframe 4 for leadless semiconductor packages comprises a plurality of cavities 41, 42, 43, 44, 45, 51, 52, 53, 54, 55 and a plurality of inter-cavity longitudinal gates 46, 47, 48, 49, 56, 57, 58, 59. Each cavity has a die pad (not shown in the figure) for supporting a die. Die 411 is, for example, attached to its die pad in cavity 41. Each cavity has a plurality of conducting portions for electrical connection to the die on the die pad. For example, the cavity 41 has three conducting portions 412, 413 and 414. In the embodiment of the invention illustrated in FIG. 4, each cavity has one die pad for supporting a die. To improve the efficiency, each cavity can have a plurality of die pads for supporting a plurality of dice.

The cavities are arranged in a matrix configuration, and are classified into a plurality of columns and a plurality of rows. For example, the cavities 41, 42, 43, 44 and 45 form a first column, and the cavities 51, 52, 53, 54 and 55 form a second column. The cavities along the direction of cavities 41 and 51 form a first row, and the cavities along the direction of cavities 42 and 52 form a second row.

The inter-cavity longitudinal gates 46, 47, 48, 49, 56, 57, 58 and 59 are situated between the cavities along the columns. For example, the longitudinal gate 46 is situated between cavity 41 and cavity 42 for connecting the cavity 41 and the cavity 42. Similarly, the longitudinal gate 47 is situated between the cavity 42 and the cavity 43 for connecting the cavity 42 and the cavity 43. Therefore, the cavities 41, 42, 43, 44 and 45 are connected by the longitudinal gates 46, 47, 48 and 49. Similarly, the cavities 51, 52, 53, 54 and 55 are connected by the longitudinal gates 56, 57, 58 and 59.

Molding material is injected into the cavities along the columns of the leadframe 4 via the longitudinal gates to package the dice in the cavities. For example, firstly the molding material is injected into a first longitudinal gate 40 of the first column, and then flows into the cavity 41 of the first column via the first longitudinal gate 40. In sequence, the molding material flows into the longitudinal gate 46, the cavity 42, the longitudinal gate 47, the cavity 43, the longitudinal gate 48, the cavity 44, the longitudinal gate 49, and the cavity 45 to package the dice in the cavities along the first column.

Figure 1:
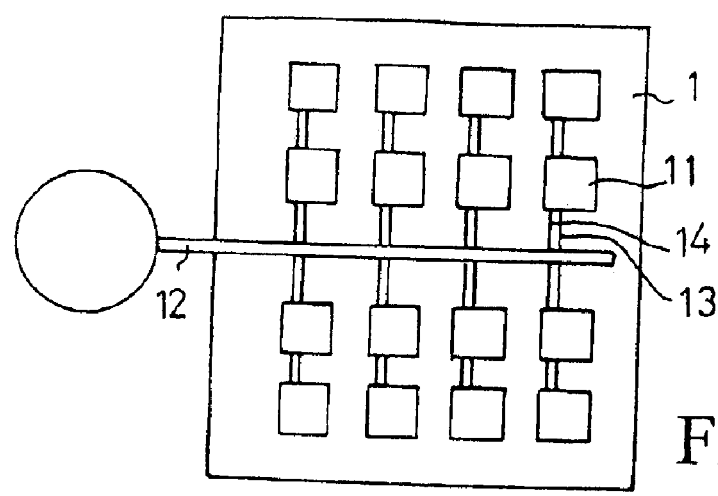
FIG. 1 shows a conventional leadframe for packaging semiconductor devices with leads.
Figure 2:
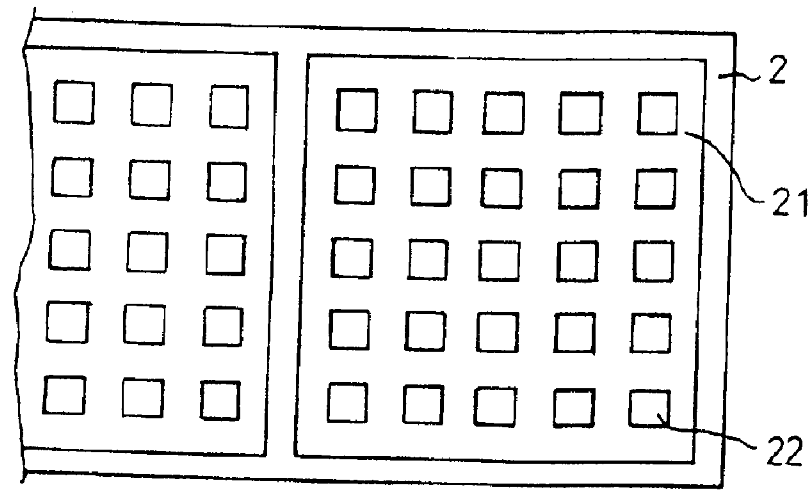
FIG. 2 shows a conventional leadframe for packaging leadless semiconductor devices.
Figure 3:
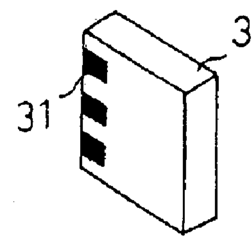
FIG. 3 shows a conventional leadless semiconductor device.

The leadframe 4 of the invention does not have the runner 12 as shown in the conventional leadframe 1 of FIG. 1, and the leadframe 4 can have more space to support more dice. The density of dice accommodated by the leadframe 4 can be high, and the packaging efficiency can be improved. Besides, the molding material left in the runner can be minimized by using the leadframe 4 of the invention so as to decrease the manufacturing cost.

According to the embodiment of the invention, to further improve the packaging quality, the leadframe 4 further comprises a plurality of transverse (or horizontal) gates 61, 62, 63, 64 and 65. The transverse gates are situated between the cavities along the rows. For example, the horizontal gate 61 is situated between the cavity 41 and the cavity 51 for connecting the cavity 41 and the cavity 51. Similarly, the transverse gate 62 is situated between the cavity 42 and the cavity 52 for connecting the cavity 42 and the cavity 52. When the molding material is injected into the cavities along the columns, the molding material can flow into the transverse gates so as to balance the pressure between the cavities along the rows. The bubbles induced in the cavities by the molding material can be drained by the transverse gates to further improve the packaging quality.

Figure 5:
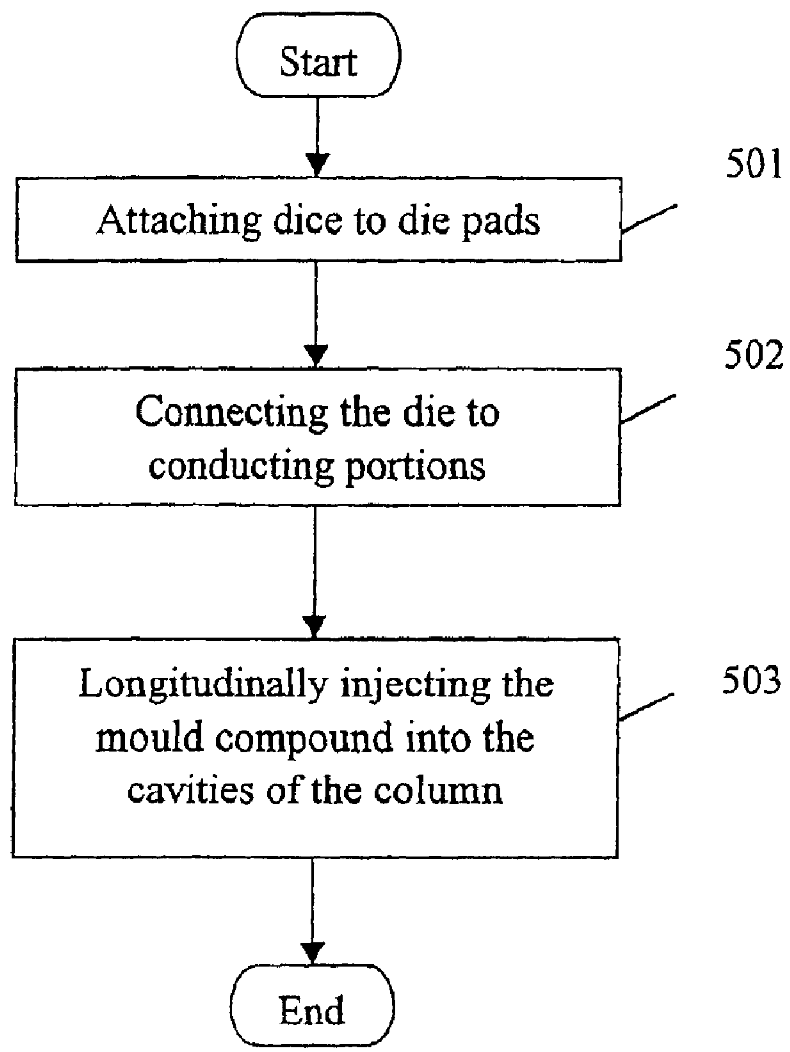
FIG. 5 shows a flow chart illustrating an encapsulation method for leadless semiconductor packages according to the present invention.

Referring to FIG. 5, the flow chart illustrates an encapsulation method for semiconductor packages according to the present invention. In step 501, the dice are attached to the die pads in the cavities of the leadframe 4. The leadframe 4 has a plurality of cavities arranged in a matrix configuration and classified into a plurality of columns and a plurality of rows. In step 502, the dice are electrically connected to the conducting portions of the leadframe 4.

In step 503, the molding material is injected longitudinally to package the dice. The molding material is injected into the cavities along the columns via the longitudinal gates to package the dice in the cavities along the columns. The longitudinal gates are situated between the cavities along the columns.

In step 503, the molding material can flow into the transverse gates so as to balance the pressure between the cavities along the rows and to drain the bubbles induced in the cavities by the molding material. The transverse gates are situated between the cavities along the rows.

The method of the invention does not need a film to prevent molding flash, and can solve the problem of molding flash remaining on the conducting portions. The method of the invention does not use expensive cutting equipment so as to decrease the cost and to upgrade the efficiency.

While embodiments of the present invention have been illustrated and described, various modifications and improvements can be made by those skilled in the art. The embodiments of the present invention are therefore described in an illustrative but not restrictive sense. It is intended that the present invention not be limited to the particular forms as illustrated, and that all the modifications not departing from the spirit and scope of the present invention are within the scope as defined in the appended claims.

I claim:

1. A leadframe for leadless semiconductor packages, the leadframe comprising:

a plurality of cavities wherein each of said cavities is connected to an adjacent cavity in the same column by a longitudinal gate and also connected to an adjacent cavity in the same row by a transverse gate and wherein each gate is connected separately to a corresponding cavity, each cavity having (a) at least one die pad for supporting at least one die and (b) a plurality of conducting portions for electrical connection to the at least one die, the cavities arranged in a matrix of columns and rows;

a first gate connected to a first cavity for introducing a molding compound into said first cavity;

a second gate connecting said first cavity to a second cavity, for flowing said molding compound into said second cavity from said first cavity; and a third gate connecting said first cavity to a third cavity, for flowing said molding compound into said third cavity from said first cavity.

2. The leadframe of claim 1, wherein said first gate it a longitudinal gate, said second gate is a longitudinal gate and said third gate is a transverse gate.

3. The leadframe of claim 1, wherein said first gate is a longitudinal gate, said second gate is a transverse gate and said third gate is a transverse gate.

4. The leadframe of claim 1, further comprising a longitudinal fourth gate connecting said first cavity to a fourth cavity.

5. A leadframe for leadless semiconductor packages, the leadframe comprising:

a plurality of cavities wherein each of said cavities is connected to an adjacent cavity in the same column by a longitudinal gate and also connected to an adjacent cavity in the same row by a transverse gate and wherein each gate is connected separately to a corresponding cavity, each cavity having (a) at least one die pad for supporting at least one die and (b) a plurality of conducting portions for electrical connection to the at least one die, the cavities arranged in a matrix of columns and rows;

a first gate connecting a first cavity to a second cavity;

a second gate connecting said first cavity to a third cavity; and a third gate connecting said first cavity to a fourth cavity.

6. The leadframe of claim 5, wherein said first and second gates are transverse gates and said third gate is a longitudinal gate.

7. The leadframe of claim 5, wherein said first and second gates are longitudinal gates and said third gate is a traverse gate.

* * * * *